United States Patent [19]

Kondo et al.

[11] 4,399,211
[45] Aug. 16, 1983

[54] PHOTOPOLYMERIZABLE COMPOSITIONS

[75] Inventors: Syunichi Kondo; Akihiro Matsufuji; Akira Umehara; Toshinao Ukai, all of Asaka; Akira Sato, Minami ashigara, all of Japan

[73] Assignee: Fuji Photo Film Co., Ltd., Kanagawa, Japan

[21] Appl. No.: 203,756

[22] Filed: Nov. 3, 1980

Related U.S. Application Data

[63] Continuation of Ser. No. 2,778, Jan. 11, 1979, abandoned.

[30] Foreign Application Priority Data

Jan. 11, 1978 [JP] Japan ................................. 53-1755

[51] Int. Cl.$^3$ .............................................. G03C 1/68
[52] U.S. Cl. .................................... 430/269; 430/281; 430/285; 430/286; 430/287; 430/288; 430/916; 430/920; 430/915; 204/159.23; 204/159.24; 430/945
[58] Field of Search ............... 430/286, 916, 920, 285, 430/287–288, 915, 281, 269, 945; 204/159.23, 159.24

[56] References Cited

U.S. PATENT DOCUMENTS

| | | |
|---|---|---|
| 3,106,466 | 10/1963 | Sprague et al. . |
| 3,640,718 | 2/1972 | Smith . |
| 3,808,006 | 4/1974 | Smith . |
| 3,899,338 | 8/1975 | Lewis . |
| 3,905,815 | 9/1975 | Bonham . |
| 3,961,961 | 6/1976 | Rich . |
| 3,987,037 | 10/1976 | Bonham et al. . |
| 4,014,702 | 3/1977 | Hinata et al. . |
| 4,050,936 | 9/1977 | Takeda et al. ...................... 430/502 |
| 4,148,658 | 4/1979 | Kondoh et al. . |

Primary Examiner—Won H. Louie, Jr.
Attorney, Agent, or Firm—Sughrue, Mion, Zinn, Macpeak & Seas

[57] ABSTRACT

In a photopolymerizable composition comprising, as essential components, (A) a compound having at least one ethylenically unsaturated double bond capable of undergoing addition polymerization and (B) a photopolymerization initiator, the improvement which comprises that the photopolymerization initiator comprising a combination of (a) a 5-[(arenooxazol-2-ylidene)ethylidene]-2-thiohydantoin compound represented by the general formula (I) (a 5-[(substituted benzoxazol-2'-ylidene)ethylidene]-2-thiohydantoin compound) or (II) (a 5-[substituted naphthol(1,2-D)oxazol-2-ylidene)ethylidene]-2-thiohydantoin compound) and (b) a 2,4,6-substituted-1,3,5-triazine compound represented by the formula (III):

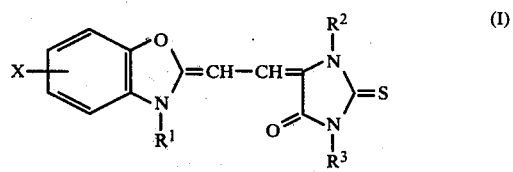

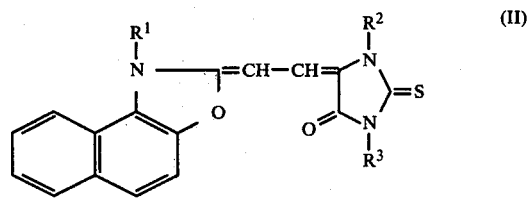

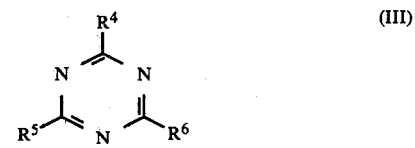

wherein X represents a hydrogen atom, an alkyl group, a substituted alkyl group, an alkoxy group, an aryl group, a substituted aryl group, an aryloxy group, an aralkyl group or a halogen atom; $R^1$, $R^2$ and $R^3$ each represents an alkyl group, a substituted alkyl group, an alkenyl group, an aryl group, a substituted aryl group or an aralkyl group, which may be the same or different; and $R^4$, $R^5$ and $R^6$ each represents an alkyl group, a substituted alkyl group, an aryl group, a substituted aryl group or an aralkyl group, which may be the same or different but at least one of which represents a mono-, di- or trihalogenomethyl group.

16 Claims, No Drawings

PHOTOPOLYMERIZABLE COMPOSITIONS

This is a continuation of application Ser. No. 2,778, filed Jan. 11, 1979 now abandoned.

BACKGROUND OF THE INVENTION

1. Field of the Invention

The present invention relates to photopolymerizable compositions and, particularly, to photopolymerizable compositions containing a photopolymerization initiator having a novel composition, which is sensitive to, for example, argon laser beams.

2. Description of the Prior Art

It has been well known that images can be formed by a process which comprises preparing a photopolymerizable composition comprising a compound having at least one ethylenically unsaturated double bond capable of undergoing addition polymerization (hereinafter "ethylenic compound"), a photopolymerization initiator and, if necessary, a binder polymer having film forming ability, a thermal polymerization inhibitor or a plasticizer, etc.; preparing a solution of the photopolymerizable composition, applying the solution to a support to produce a photosensitive material having a photopolymerizable composition layer (photosensitive layer), imagewise exposing the sensitive layer to light according to the desired original to harden the exposed portions by polymerization, and processing with an organic solvent capable of dissolving only the unhardened portions to remove the unhardened portions by dissolution, by which images composed of the hardened portions are formed.

It has also been known that images can be formed by a process which comprises forming a laminate by pressing the photosensitive material described above to an image support (one of the support of the photosensitive material and the image support is transparent), exposing it imagewise to light through the transparent support side to polymerize the exposed portions of the sensitive layer, by which the adhesion to the support in the photosensitive material and the adhesion to the image support change, and the adhesive strength in the exposed portions becomes different from that in the unexposed portions; and separating both supports by stripping in the state that the unexposed portions of the sensitive layer adhere to one support and the exposed portions of the sensitive layer adhere to the other support, by which images composed of the sensitive layer are formed.

In such processes, benzyl, benzoin, anthraquinone and Michler's ketone, etc., have been used as photopolymerization initiators. However, photopolymerizable compositions containing these photopolymerization initiators are hardly sensitive to ultraviolet radiation having long wavelengths or visible radiation, for example, they are hardly sensitive to argon laser beams, and do not have a polymerization initiating ability, though they are sensitive to ultraviolet radiation having comparatively short wavelengths. It is very desirable to use visible radiation as light sources for exposure in image formation or light sources capable of scanning, for example, laser beams, and for this reason prior art photopolymerization initiators have not been satisfactory.

SUMMARY OF THE INVENTION

A principal object of the present invention is to overcome the above-described problems with prior photopolymerizable compositions.

A more particular object of the present invention is to provide a photopolymerization initiator combination which is sensitive to near ultraviolet radiation having long wavelength or visible light.

A more particular object of the present invention is to provide a photopolymerization initiator composition sensitive to argon laser beams.

A further object of the present invention is to provide a photopolymerizable composition which can be developed by either a solvent or by stripping-off development.

Another object of the present invention is to provide a photopolymerizable composition which is sensitive to a wide variety of sources of radiation.

DETAILED DESCRIPTION OF THE INVENTION

The present invention relates to (1) photopolymerizable compositions comprising, as essential components, (A) a compound having at least one ethylenically unsaturated double bond capable of undergoing addition polymerization and (B) a photopolymerization initiator, in which the photopolymerization initiator comprises a combination of (a) a 5-[(arenooxazol-2-ylidene)ethylidene]-2-thiohydantoin compound represented by the general formula (I) (a 5-[(substituted benzoxazol-2'-ylidene)ethylidene]-2-thiohydantoin compound) or (II) (a 5-[substituted naphthol(1,2-D)oxazol-2-ylidene)ethylidene]-2-thiohydantoin compound) and (b) a 2,4,6-substituted-1,3,5-triazine compound represented by the formula (III):

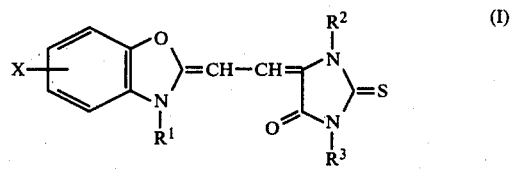

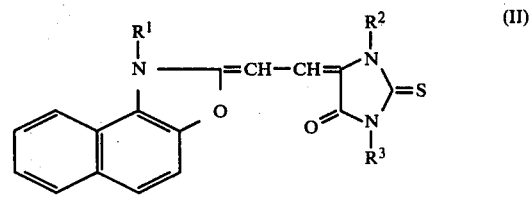

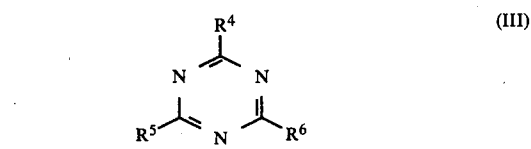

wherein X represents a hydrogen atom, an alkyl group, a substituted alkyl group, an alkoxy group, an aryl group, a substituted aryl group, an aryloxy group, an aralkyl group or a halogen atom; $R^1$, $R^2$ and $R^3$ each represents an alkyl group, a substituted alkyl group, an alkenyl group, an aryl group, a substituted aryl group or an aralkyl group, which may be the same or different; and $R^4$, $R^5$ and $R^6$ each represents an alkyl group, a substituted alkyl group, an aryl group, a substituted aryl group or an aralkyl group, which may be the same or different but at least one of $R^4$, $R^5$ and $R^6$ represents a mono-, di- or trihalogenomethyl group; and (2) photopolymerizable compositions described in (1) which contain (C) a polymer having film forming ability and being compatible with the components (A) and (B) as a binder.

The compound having at least one ethylenically unsaturated double bond capable of undergoing addition polymerization (the ethylenic compound) is a component which is converted into a polymer or a highly polymerized material having a linear or branched or network structure of a high molecular weight by addition polymerization as a function of the photo-decomposition product of the photopolymerization initiator (mixture), by which the hardness of the photopolymerizable composition increases and the solubility thereof in organic and/or inorganic solvents decreases or it becomes substantially insoluble.

The ethylenic compounds include monomers, prepolymers (namely, dimers, trimers, tetramers), and oligomers (that is, polymers and polycondensation products having a molecular weight less than about 10,000), mixtures thereof and copolymers thereof having a low degree of polymerization. Examples of the ethylenic compounds include unsaturated carboxylic acids, unsaturated carboxylic acid salts, esters of unsaturated carboxylic acids and aliphatic polyhydroxy compounds (hereinafter "aliphatic polyols") or aromatic polyhydroxy compounds (hereinafter "polyhydric phenol") and oligoesters obtained by esterification reaction of di- or polybasic carboxylic acids, The use of ethylenic compounds in photopolymerizable compositions is taught, for example, in U.S. Pat. Nos. 2,760,863, 3,060,026, 3,261,686, 3,770,438, 3,732,107 and 4,050,936, and British Patent No. 1,533,250.

In a case of using a photopolymerizable composition that is substantially nonfluid at normal temperatures (about 10° C. to about 40° C.), it is possible to use ethylenic compounds having a boiling point of about 100° C. or more under atmospheric pressure. However, in a case of a photopolymerizable composition which is fluid at normal temperatures, it is possible to use ethylenic compounds having the boiling point of about 30° C. or more and preferably in a range of from about 40° C. to about 100° C. under the atmospheric pressure.

Examples of the unsaturated carboxylic acids include acrylic acid, methacrylic acid, itaconic acid, crotonic acid, isocrotonic acid and maleic acid. As the unsaturated carboxylic acid salts, there are sodium salts and potassium salts of the above-described unsaturated carboxylic acids.

As the aliphatic polyols described above, there are dihydric alcohols such as ethylene glycol, diethylene glycol, triethylene glycol, tetraethylene glycol, tetramethylene glycol, neopentyl glycol, 1,10-decanediol, 1,2-butandiol, 1,3-butanediol, propylenediol or propylene glycol, etc., trihydric alcohols such as trimethylolethane, trimethylolpropane, etc., and polymers thereof, tetra- or polyhydric alcohols such as pentaerythritol, dipentaerythritol, tripentaerythritol and other polypentaerythritols, etc., saccharides such as sorbitol, d-mannitol, etc., and dihydroxycarboxylic acids such as dihydroxymaleic acid, etc.

As the polyhydric phenols, there are hydroquinone, catechol, resorcinol, phloroglucinol, pyrogallol, etc.

Examples of the esters of aliphatic polyols and unsaturated carboxylic acids include the following esters. As acrylic acid esters, there are ethylene glycol diacrylate, triethylene glycol triacrylate, 1,3-butanediol diacrylate, tetramethylene glycol diacrylate, propylene glycol diacrylate, trimethylolpropane triacrylate, trimethylolethane triacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, sorbitol triacrylate, sorbitol tetraacrylate, sorbitol pentaacrylate, sorbitol hexaacrylate, polyester acrylate oligomers, etc.

As the methacrylic acid esters, there are tetramethylene glycol dimethacrylate, triethylene glycol dimethacrylate, trimethylolpropane trimethacrylate, trimethylolethane trimethacrylate, pentaerythritol dimethacrylate, pentaerythritol trimethacrylate, dipentaerythritol dimethacrylate, dipentaerythritol tetramethacrylate, tripentaerythritol octamethacrylate, ethylene glycol dimethacrylate, 1,3-butanediol dimethacrylate, tetramethylene glycol dimethacrylate, sorbitol tetramethacrylate, etc.

As itaconic acid esters, there are ethylene glycol diitaconate, propylene glycol diitaconate, 1,3-butanediol diitaconate, 1,4-butanediol diitaconate, tetramethylene glycol diitaconate, pentaerythritol diitaconate, dipentaerythritol triitaconate, dipentaerythritol pentaitaconate, dipentaerythritol hexaitaconate, sorbitol tetraitaconate, etc.

As crotonic acid esters, there are ethylene glycol dicrotonate, propylene glycol dicrotonate, tetramethylene glycol dicrotonate, pentaerythritol dicrotonate, sorbitol tetracrotonate, etc. As isocrotonic acid esters, there are ethylene glycol diisocrotonate, pentaerythritol diisocrotonate, sorbitol diisocrotonate, etc. As maleic acid esters, there are ethylene glycol dimaleate, triethylene glycol dimaleate, pentaerythritol dimaleate, sorbitol tetramaleate, etc.

Further, mixtures of the above-described esters are included.

Examples of the above-described oligoesters include oligoester acrylates and oligoester methacrylates.

The oligoester acrylates and methacrylates are reaction products obtained by esterification reaction of acrylic acid or methacrylic acid, a polybasic carboxylic acid and a polyol, which are compounds having a presumable structure represented by the general formula (IV):

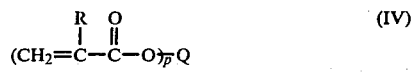

wherein R represents a hydrogen atom or a methyl group, Q represents an ester residue composed of a polyhydric alcohol and a polybasic carboxylic acid which contains at least one ester bond, and p is an integer of 1 to 6.

Examples of the polyols composing the ester residue Q include polyols such as ethylene glycol, 1,2-propylene glycol, 1,4-butanediol, 1,6-hexanediol, trimethylolpropane, trimethylolethane, 1,2,6-hexanetriol, glycerine, pentaerythritol, sorbitol, etc., and polyether type polyols such as diethylene glycol, triethylene glycol, tetraethylene glycol, decaethylene glycol, tetradecaethylene glycol, polyethylene glycol, dipropylene glycol, tripropylene glycol, tetrapropylene glycol, polypropylene glycol, etc.

On the other hand, examples of the polybasic carboxylic acids composing the ester residue Q include aromatic polybasic carboxylic acids such as phthalic acid, isophthalic acid, terephthalic acid, tetrachlorophthalic acid, tetrabromophthalic acid, trimellitic acid, pyromellitic acid, benzophenone dicarboxylic acid, etc., unsaturated aliphatic polybasic carboxylic acids such as maleic acid, fumaric acid, $\Delta^2$-tetrahydrophthalic acid, $\Delta^4$-tetrahydrophthalic acid, 5-norbornene-2,3-dicarboxylic acid, itaconic acid, etc., and saturated aliphatic polybasic acids such as malonic acid, succinic acid, glutaric acid, adipic acid, pimelic acid, sebacic acid, dodecanoic acid, etc.

The ester residue Q may be composed of one of the above-described aliphatic polyols and one of the polycarboxylic acids as well as two or more of one or both of the aforesaid polyols and polycarboxylic acids. Furthermore, the ester residue Q may contain one molecule of the aforesaid aliphatic polyol and one molecule of the aforesaid polycarboxylic acid as well as two or more molecules of one or both of the aliphatic polyol and polycarboxylic acid. That is, any ester residue containing at least one ester bond can be used as Q. Further, the ester residure Q may contain a hydroxyl group or a hydroxyl group esterified with a monobasic carboxylic acid or the ester residue may be substituted by an alkoxy group such as a methoxy group or an ethoxy group.

Further, there are oligoesters containing a carboxylic acid group remaining therein. The value of p in the general formula (IV) and the number of ester bonds included in Q are generally in a range of 1 to B 6. When the value of p is 2 or more, those which contain only the acryloyl group or the methacryloyl group in one polyester acrylate or methacrylate molecule may be used, and those which contain the acryloyl group and the methacryloyl group in a suitable ratio in one molecule may be used as well. The ester residue Q generally has a molecular weight of less than 10,000, preferably less than 3,000. Presumable structural formulas of the oligoester acrylates and methacrylates are shown in Table 1. In addition, examples of the oligoesters include unsaturated esters described in Japanese Patent Application (OPI) No. 9676/72 (The term "OPI" as used herein refers to a "published unexamined Japanese patent application") (corresponding to U.S. Pat. No. 3,732,107). In the Table 1, Y represents an acryloyl group

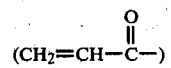

or a methacryloyl group

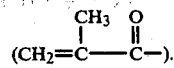

TABLE 1

Oligoester Acrylates or Methacrylates

Y—OCH₂CH₂OOC—CH=CH—COOCH₂CH₂OH

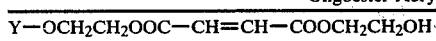

Y—O(CH₂CH₂O)₂OC—C₆H₄—CO(OCH₂CH₂)₂OH
Y(O(CH₂)ₓOOC(CH₂)ₓCO)₂O(CH₂)ₓOOC—CH₃
Y—OCH₂CH₂OOC—C₆H₄—COOCH₂CH₂O—Y
Y(OCH₂CH₂OOC—C₆H₄—CO)₂OCH₂CH₂O—Y
Y—O(CH₂CH₂O)₃OC—CH=CH—CO(OCH₂CH₂)₃O—Y

Y((OCH₂CH₂)₃OOC(CH₂)ₓCO)₂O(CH₂CH₂O)₃Y
Y((OCH₂CH₂)₂OOC—C₆H₄—CO)₃O(CH₂CH₂O)₂Y
Y(OCH₂CH₂)ₙ—OOC—CH₂—COO(CH₂CH₂O)ₙ—Y

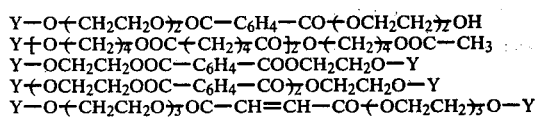

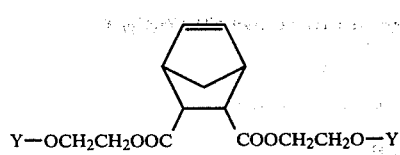

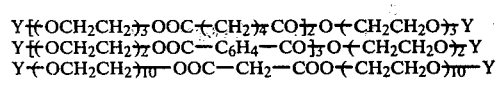

TABLE 1-continued
Oligoester Acrylates or Methacrylates
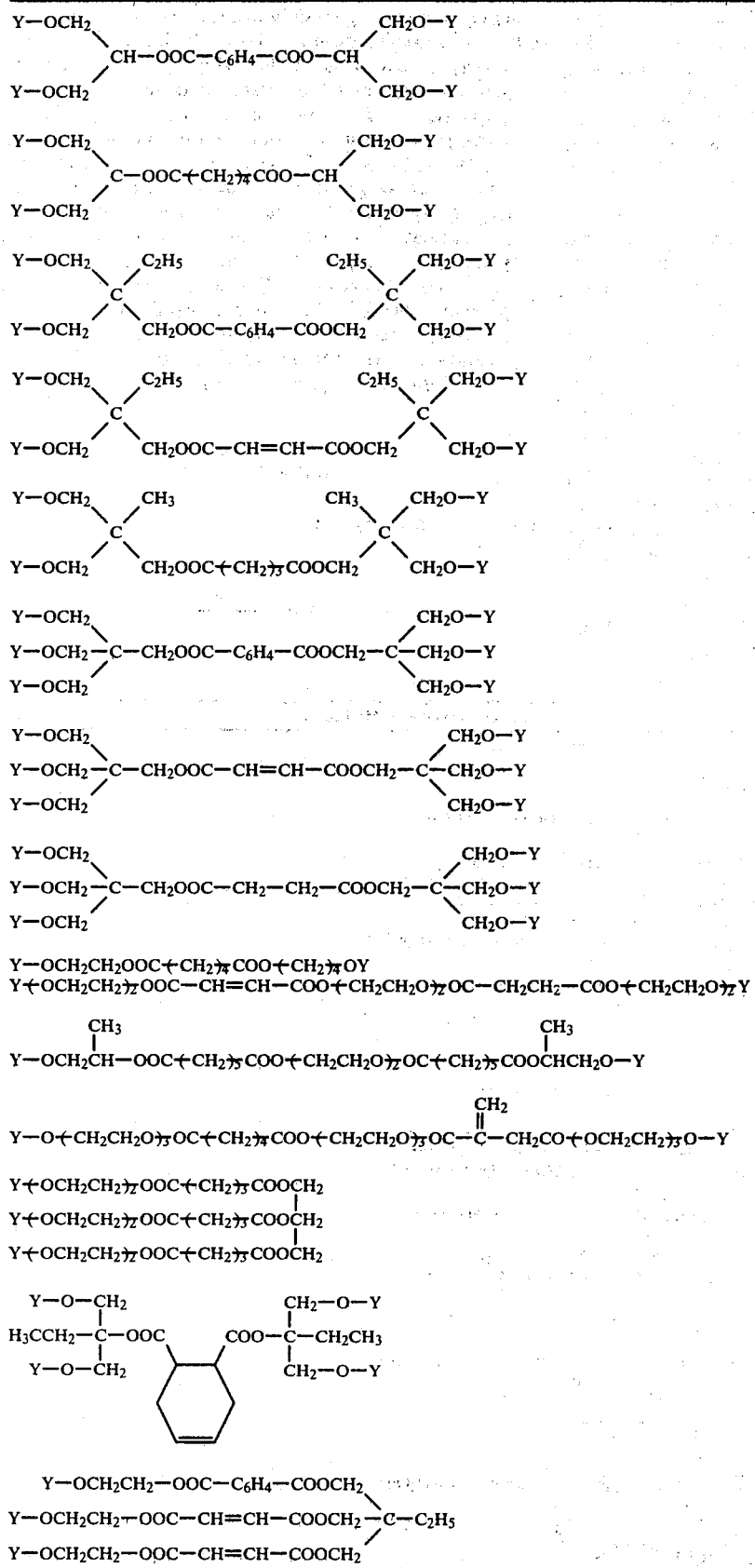

TABLE 1-continued

Oligoester Acrylates or Methacrylates

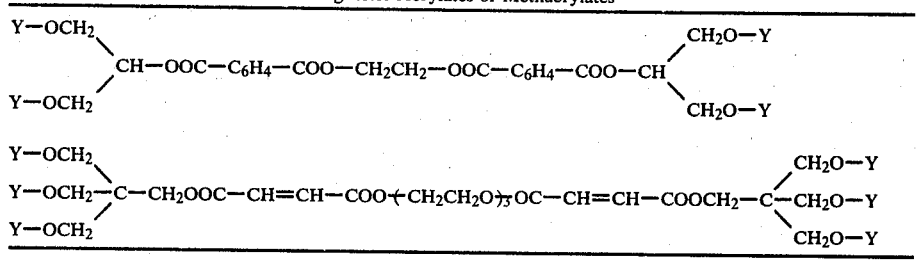

Hereinafter, the photopolymerization initiator which is a characteristic of the photopolymerizable compositions of the present invention is explained. The photopolymerization initiator is a component which decomposes upon exposure to actinic radiation to form a free radical which radical reacts with the ethylenic compound in the photopolymerizable composition to initiate addition polymerization of the ethylenic compound.

The substituent X of the 5-[(arenooxazol-2-ylidene)ethylidene]-2-thiohydantoin compound (hereinafter, referred to as the "substituted thiohydantoin") in the general formula (I) (a 5-[(substituted benzoxazol-2'-ylidene)ethylidene]-2-thiohydantoin compound) represents a hydrogen atom, an alkyl group, a substituted alkyl group, an alkoxy group, an aryl group, a substituted aryl group, an aryloxy group, an aralkyl group or a halogen atom.

As the alkyl group, there are straight, branched and cyclic alkyl groups having 1 to 18 carbon atoms, examples of which include a methyl group, an ethyl group, a propyl group, a butyl group, a pentyl group, a hexyl group, a heptyl group, an octyl group, a nonyl group, a decyl group, a dodecyl group, an octadecyl group, an isopropyl group, an isobutyl group, an isopentyl group, an isohexyl group, a sec-butyl group, a neopentyl group, a tert-butyl group, a tert-pentyl group, a cyclopentyl group, a cyclohexyl group, a cycloheptyl group and 2-norbornyl group. Among them, linear and branched alkyl groups having 1 to 10 carbon atoms and cyclic alkyl groups having 6 to 10 carbon atoms are preferred. Most preferred are linear and branched alkyl groups having B 1 to 4 carbon atoms.

As substituents for the substituted alkyl group, there are halogen atoms (e.g., fluorine, chlorine, bromine and iodine) and a hydroxyl group. On the other hand, the alkyl moiety in the substituted alkyl group preferably contains 1 to 18 carbon atoms, and more preferably is a linear or branched alkyl group having 1 to 10 carbon atoms or a cyclic alkyl group having 6 to 10 carbon atoms. Particularly preferred as the alkyl moiety are linear and branched alkyl groups having 1 to 4 carbon atoms. Examples of the substituted alkyl groups include a chloromethyl group, a bromomethyl group, a 2-chloroethyl group, a 2,2,2-trichloroethyl group, a 2-chloropentyl group, a 1-(chloromethyl)propyl group, a 10-bromodecyl group, a chlorocyclohexyl group, a hydroxymethyl group, a 2-hydroxyethyl group, a 2-hydroxybutyl group, a 5-hydroxypentyl group, a 10-hydroxydecyl group, a 2-hydroxyoctadecyl group, a 2-(hydroxymethyl)ethyl group, a hydroxycyclohexyl group and a 3-hydroxy-2-norbornyl group.

As the alkoxy group, there are straight, branched and cyclic alkoxy groups having 1 to 10 carbon atoms and, preferably, straight and branched alkoxy groups having 1 to 4 carbon atoms. Examples of them include a methoxy group, an ethoxy group, a propoxy group, a butoxy group, a pentyloxy group, a hexyloxy group, a nonyloxy group, a decyloxy group, an isopropoxy group, a sec-butoxy group, a tert-butoxy group, an isopentyloxy group, a cyclohexyloxy group and a 2-norbornyloxy group.

As the aryl group, those having 6 to 14 carbon atoms are preferred. Examples of the aryl group include monocyclic and bicyclic aryl groups such as monovalent radicals derived from a benzene ring (e.g., a phenyl group), monovalent radicals derived from two or three condensed benzene rings (e.g., a naphthyl group, an anthryl group and a phenanthryl group), monovalent radicals derived from two linked benzene rings (e.g., a biphenylyl group) and monovalent radicals derived from a condensate of a benzene ring(s) and a 5-member unsaturated carbocyclic ring (e.g., an indenyl group, an acenaphthenyl group and a fluorenyl group).

As the substituted aryl group, there are monovalent radicals in which the ring forming carbon atoms of the above-described aryl groups are substituted by one or more substituents which may be the same or different from one another, such as halogen atom (e.g., a fluorine atom, a chlorine atom, a bromine atom and an iodine atom), substituted amino groups (monoalkylamino groups (examples of the alkyl group include a methyl group, an ethyl group, a propyl group, a pentyl group, an isopropyl group, a sec-butyl group and an isopentyl group), dialkylamino groups (examples of the alkyl groups are the same as those in monoalkylamines), monoacylamino groups (examples of the acyl group include an acetyl group, a propionyl group, a butyryl group, an isobutyryl group and valeryl group)), a cyano group, alkyl groups (straight, branched and cyclic alkyl groups having 1 to 18 carbon atoms, and, preferably, straight, branched and cyclic alkyl groups having 1 to 10 carbon atoms and, particularly, straight and branched alkyl groups having 1 to 4 carbon atoms, examples of which have been described above), halogenoalkyl groups (for example, a chloromethyl group, a 2-chloroethyl group, a 5-chloropentyl group and a trifluoromethyl group, etc.), alkoxy groups (examples of the alkyl moiety include a methyl group, an ethyl group, a butyl group, a pentyl group, an isopropyl group, an isopentyl group, a 2-methylbutyl group and a secbutyl group), aryloxy groups (examples of the aryl moiety include a phenyl group, a 1-naphthyl group and a 2-naphtyl group), alkoxycarbonyl groups (examples of the alkyl moiety include a methyl group, an ethyl group, a propyl group, an isopropyl group and a butyl group), acyloxy groups (examples of the acyl moiety are the same as those for the acyl moiety in the monacylamio groups above) and alkoxysulfonyl groups (examples of the alkyl moiety are the same as those for the alkyl moiety in the alkoxy groups above), etc.

Examples of these aryl groups and substituted aryl groups include a phenyl group, a chlorophenyl group, an aminophenyl group, a (methylamino)phenyl group, an (ethylamino)phenyl group, a (dimethylamino)phenyl group, an acetylaminophenyl group, a tolyl group, an ethylphenyl group, a (chloromethyl)phenyl group, an acetylphenyl group, a phenoxyphenyl group, a methoxycarbonylphenyl group, an ethoxycarbonylphenyl group, an acetoxyphenyl group, a methoxysulfonylphenyl group, a naphthyl group, 2-amino-1-naphthyl group, a 1-dimethylamino-2-naphthyl group, a chloronaphthyl group, a methylnaphthyl group, an anthryl group, a phenanthryl group, an indenyl group, a biphenylyl group, a chlorobiphenylyl group, an aminobiphenylyl group, a methylbiphenylyl group and acenaphthenyl group. Among them, the phenyl group and substituted phenyl groups having one or more substituents which are the same or different from one another are preferred.

As the aryloxy group, there are those having 6 to 12 carbon atoms in which the aryl moiety thereof may be monocyclic and bicyclic, such as a phenoxy group, a 1-naphthyloxy group, a 2-naphthyloxy group, a 4-biphenylyloxy group and a 3-biphenylyloxy group. Among them, the phenoxy group is preferred.

As the aralkyl group, there are those having 7 to 20 carbon atoms in which the alkyl moiety thereof has 1 to 10 carbon atoms and the aryl moiety thereof which may be monocyclic or bicyclic has 6 to 10 carbon atoms, such as monovalent radicals in which a straight, branched or cyclic alkyl group having 1 to 10 carbon atoms and preferably 1 to 6 carbon atoms is substituted by a phenyl group or a naphthyl group. Examples include a benzyl group, a phenethyl group, a 3-phenylpropyl group, a 3-phenylhexyl group, a 10-phenyldecyl group, a 4-phenylcyclohexyl group, a 1-naphthylmethyl group, a 2-(1-naphthyl)ethyl group and 2-naphthylmethyl group.

As the halogen atom, there are a fluorine atom, a chlorine atom, a bromine atom and an iodine atom. Among them, the fluorine atom, the chlorine atom and the bromine atom are preferred.

The substituents $R^1$, $R^2$ and $R^3$ of the substituted thiohydantoin represented by the general formula (I) (a 5-[(substituted benzoxazol-2'-ylidene)ethylidene]-2-thiohydantoin compound) or (II) (a 5-[substituted naphthol(1,2-D)oxazol-2-ylidene)ethylidene]-2-thiohydantoin compound) each represents an alkyl group, a substituted alkyl group, an alkenyl group, an aryl group, a substituted aryl group or an aralkyl group. In the case that they each represents an alkyl group, an aryl group, a substituted aryl group or an aralkyl group, the alkyl and aryl moieties have the same definition as the alkyl, aryl, and aralkyl moieties described for substituent X.

As the substituents of the substituted alkyl group $R^1$ to $R^3$, there are a halogen atom (fluorine, chlorine, bromine and iodine), a hydroxyl group, a carboxyl group, a cyano group, an alkoxy group (the alkyl moiety of which has the same definition as that of the above-described substituent X), an alkoxycarbonyl group (the alkyl moiety of which has the same definition as that of the above-described substituent X), a dialkylamino group (the alkyl moiety of which has the same definition as that of the above-described substituent X, and two alkyl moieties of which may be the same or different each other), a tetrahydrofuranyl group, a tetrahydropyranyl group or a dioxanyl group. In the substituted alkyl group, one or two (which may be the same or different) of these substituents may be linked to the alkyl group.

As examples of the substituted alkyl group, there are not only the above-described substituted alkyl groups for the substituent X but also a carboxymethyl group, a 2-carboxyethyl group, a 3-carboxypropyl group, a cyanomethyl group, a 2-cyanoethyl group, a 3-cyanopropyl group, a methoxymethyl group, a 2-methoxyethyl group, a 3-methoxypropyl group, an ethoxymethyl group, a dimethoxymethyl group, a 2,2-dimethoxyethyl group, a 2,2-diethoxyethyl group, a methoxycarbonylmethyl group, an ethoxycarbonylmethyl group, a propoxycarbonylmethyl group, a 2-(methoxycarbonyl)ethyl group, a 2-(ethoxycarbonyl)ethyl group, a dimethylamino group, a diethylamino group, a dipropylamino group, a methylethylamino group, a 2-tetrahydrofuranyl group, a 2-tetrahydropyranyl group, a 4-tetrahydropyranyl group and a dioxanyl group.

As the alkenyl group, there are straight and branched alkenyl groups having 2 to 4 carbon atoms, examples of which include a vinyl group, an allyl group, a 1-propenyl group, a 2-butenyl group, a 3-butenyl group and an isopropenyl group.

The substituted thiohydantoins represented by the general formulas (I) and (II) can be synthesized according to processes described in *Journal of American Chemical Society*, Vol. 73, pp. 5326–5332 (1951) (L. G. S. Brooker, G. H. Keyes, R. H. Sprague, R. H. VanDyke, E. VanLare, G. VanZandt and F. L. White; the report "Studies in the Cyanine Dye Series. XI. The Merocyanines").

For example, a compound of the formula (I) wherein $R^1$ is ethyl, $R^2$ is methyl and $R^3$ is phenyl can be synthesized in the following manner.

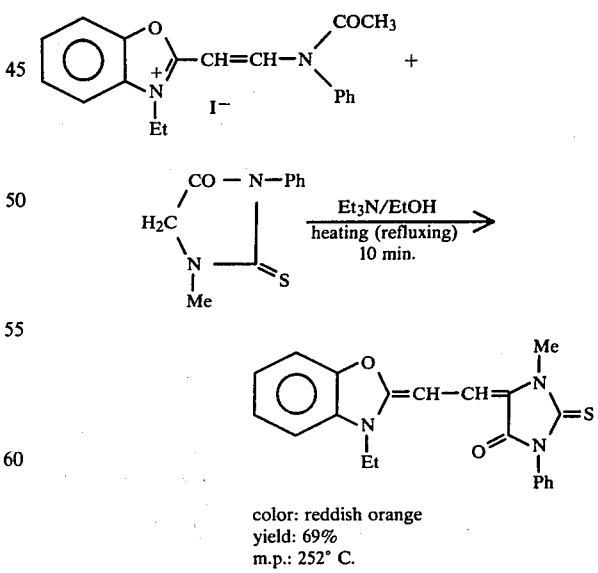

color: reddish orange
yield: 69%
m.p.: 252° C.

Similarly, a compound of the formula (II) wherein $R^1$ is ethyl, $R^2$ is methyl and $R^3$ is phenyl can be synthesized as follows.

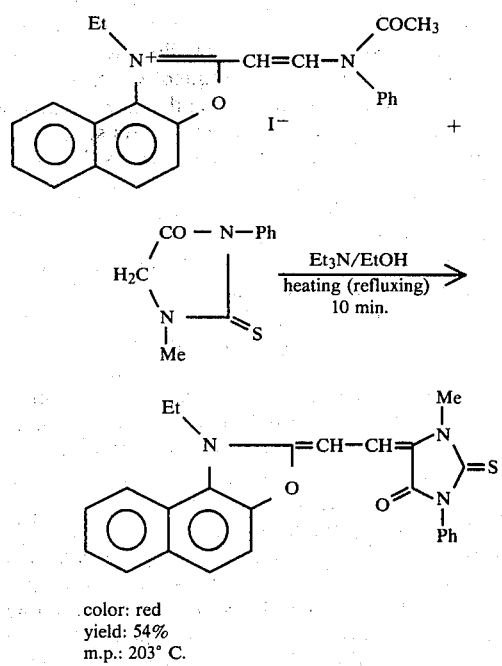

color: red
yield: 54%
m.p.: 203° C.

Further, they are available from Nippon Kanko-shikiso Kenkyusho.

Examples of the substituted thiohydantoins represented by the general formula (I) (a 5-[(substituted benzoxazol-2'-ylidene)ethylidene]-2-thiohydantoin compound) and (II) (a 5-[substituted naphthol(1,2-D)oxazol-2-ylidene)ethylidene]-2-thiohydantoin compound) include (hereinafter benzoxazolylidene is benzoxazol-2'-ylidene):

| Compound No. | Compound |
|---|---|
| a-1 | 1,3-diethyl-5-[(3'-ethylbenzoxazolylidene)-ethylidene]-2-thiohydantoin (melting point: 205–206° C.) |
| a-2 | 1-methyl-3-allyl-5-[(3'-ethylbenzoxazolylidene)-ethylidene]-2-thiohydantoin (melting point: 206–207° C.) |
| a-3 | 1-carboxymethyl-3-phenyl-5-[(3'-ethylbenzoxazolylidene)ethylidene]-2-thiohydantoin |
| a-4 | 1-(2-ethoxyethyl)-3-phenyl-5-[(3'-ethylbenzoxazolylidene)ethylidene]-2-thiohydantoin |
| a-5 | 1-carboxymethyl-3-ethyl-5-[(3'-ethylbenzoxazolylidene)ethylidene]-2-thiohydantoin (melting point: 225–227° C.) |
| a-6 | 1-methoxycarbonylmethyl-3-phenyl-5-[(3'-ethylbenzoxazolylidene)ethylidene]-2-thiohydantoin (melting point: 222–224° C.) |
| a-7 | 1-(2-hydroxyethyl)-3-phenyl-5-[(3'-ethylbenzoxazolylidene)ethylidene]-2-thiohydantoin |
| a-8 | 1-(2-tetrahydrofurannyl)methyl-3-(p-dimethylaminophenyl)-5-[(3'-ethylbenzoxazolylidene)ethylidene]-2-thiohydantoin (melting point: 204–206° C.) |
| a-9 | 1-(2-tetrahydrofuranyl)methyl-3-(p-dimethylaminophenyl)-5-[(3'-ethyl-5'-chlorobenzoxazolylidene)-ethylidene]-2-thiohydantoin |
| a-10 | 1-(3-methoxypropyl)-3-(p-dimethylaminophenyl)-5-[(3'-ethyl-5'-chlorobenzoxazolylidene)ethylidene]-2-thiohydantoin |
| a-11 | 1-(2,2-diethoxyethyl)-3-phenyl-5-[(3'-ethylbenzoxazolylidene)ethylidene]-2-thiohydantoin (melting point: 221–224° C.) |
| a-12 | 1-(2-hydroxyethyl)-3-phenyl-5-[(3'-ethyl-5'-methylbenzoxazolylidene)ethylidene]-2-thiohydantoin |
| a-13 | 1-(2-cyanoethyl)-3-phenyl-5-[(3'-ethylbenzoxazolylidene)ethylidene]-2-thiohydantoin |
| a-14 | 1-(2-hydroxyethyl)-3-ethyl-5-[(3'-ethylbenzoxazolylidene)ethylidene]-2-thiohydantoin |
| a-15 | 1-(2-dimethylaminoethyl)-3-(p-dimethylaminophenyl)-5-[(3'-ethylbenzoxazolylidene)ethylidene]-2-thiohydantoin |
| a-16 | 1-allyl-3-(p-dimethylaminophenyl)-5-[(3'-ethyl-4'-chlorobenzoxazolylidene)ethylidene]-2-thiohydantoin |
| a-17 | 1-(3-methoxypropyl)-3-(p-dimethylaminophenyl)-5-[(3'-ethylbenzoxazolylidene)ethylidene]-2-thiohydantoin (melting point: 237–238° C.) |
| a-18 | 1-(2-tetrahydrofuranyl)methyl-3-phenyl-5-[(3'-ethyl-5'-chlorobenzoxazolylidene)ethylidene]-2-thiohydantoin |
| a-19 | 1-allyl-3-(p-dimethylaminophenyl)-5-[(3'-ethylbenzoxazolylidene)ethylidene]-2-thiohydantoin |
| a-20 | 1-carboxymethyl-3-phenyl-5-[(1'-ethylnaphtho-[1,2-d]oxazol-2-ylidene)ethylidene]-2-thiohydantoin |
| a-21 | 1-(2-hydroxyethyl)-3-phenyl-5-[(1'-ethylnaphtho-[1,2-d]oxazol-2-ylidene)ethylidene]-2-thiohydantoin |
| a-22 | 1,3-diphenyl-5-[(3'-ethylbenzoxazolylidene)-ethylidene]-2-thiohydantoin (melting point: 225–227° C.) |
| a-23 | 1,3-dimethyl-5-[(3'-ethylbenzoxazolylidene)-ethylidene]-2-thiohydantoin |
| a-24 | 1,3-dimethyl-5-[(3'-methylbenzoxazolylidene)-ethylidene]-2-thiohydantoin |

The substituents $R^4$, $R^5$ and $R^6$ of the 2,4,6-substituted-1,3,5-triazines represented by the general formula (III) as the component (b) represent each of an alkyl group, a substituted alkyl group, an aryl group, a substituted aryl group or an aralkyl group, which may be identical or different to one another but at least one of which represents a mono-, di- or trihalogenomethyl group. In the case that $R^4$, $R^5$ and $R^6$ represent each an alkyl group, a substituted alkyl group, an aryl group, a substituted aryl group or an aralkyl group, they have the same definition as in the case of the above-described substituent X representing an alkyl group, a substituted alkyl group, an aryl group, a substituted aryl group or an aralkyl group. Examples of mono-, di- or trihalogenomethyl group are a chloromethyl group, a bromoethyl group, an iodomethyl group, a dichloromethyl group, a dibromomethyl group, a diiodomethyl group, a trichloromethyl group, a tribromomethyl group or a triiodomethyl group.

The 2,4,6-substituted-1,3,5-triazines represented by the general formula (III) can be synthesized according to processes described in T. R. Norton, *Journal of American Chemical Society*, "A New Synthesis of Ethyl Trifluoroacetate", Vol. 72, pp. 3527–3528 (1950) and T. L. Cairns, A. W. Larchar and B. C. McKusick, ibid., "The Trimerization of Nitriles at High Pressures", Vol. 74, pp. 5633–5636 (1952) and Ch. Crundmann, G. Weisse and S. Seide, *Justus Liebigs Annalen der Chemie*, "Uber Triazine, III Uber den Mechanismus der Polymerisation von Nitrilen zu 1,3,5-Triazinen", Vol. 577, pp. 77–95 (1952). For example, they are conveniently prepared by reacting trichlorocyanomethane in the presence of HCl and $AlBr_3$ at 0° C.

Examples of the 2,4,6-substituted-1,3,5-triazines represented by the general formula (III) include:

| Compound No. | Compound |
|---|---|
| b-1 | 2-methyl-4,6-bis(trichloromethyl)-1,3,5-triazine |
| b-2 | 2,4,6-tris(trichloromethyl)-1,3,5-triazine |
| b-3 | 2-methyl-4,6-bis(tribromomethyl)-1,3,5-triazine |
| b-4 | 2,4,6-tris(tribromomethyl)-1,3,5-triazine |
| b-5 | 2,4,6-tris(dichloromethyl)-1,3,5-triazine |
| b-6 | 2,4,6-tris(dibromomethyl)-1,3,5-triazine |
| b-7 | 2,4,6-tris(bromomethyl)-1,3,5-triazine |
| b-8 | 2,4,6-tris(chloromethyl)-1,3,5-triazine |
| b-9 | 2-phenyl-4-6-bis(trichloromethyl)-1,3,5-triazine |
| b-10 | 2-(p-methoxyphenyl)-4,6-bis(trichloromethyl)-1,3,5-triazine |
| b-11 | 2-phenyl-4,6-bis(tribromomethyl)-1,3,5-triazine |
| b-12 | 2-(p-chlorophenyl)-4,6-bis(trichloromethyl)-1,3,5-triazine |
| b-13 | 2-(p-tolyl)-4,6-bis(trichloromethyl)-1,3,5-triazine |

Of the compounds of formula (III), those having a halogenoalkyl group at each of $R^4$, $R^5$ and $R^6$ and, particularly, a trihalomethyl group are preferred.

The photopolymerization initiator which is the characteristic of the present invention and included in the photopolymerizable compositions comprises a combination of the compounds (a) and (b) as described above. In the combination at which the effect of the present invention is remarkably exhibited, a ratio by weight of the compound (a) to the compound (b) is in the range of from about 1:10 to about 10:1 and, preferably, from about 1:5 to about 5:1 in any case.

In the photopolymerizable compositions of the present invention, the component (B) as the photopolymerization initiator may be included in an amount of the range of from about 0.1% to about 20% by weight and, preferably, from about 0.2% to about 10% by weight, based on the ethylenic compound of the component (A).

The photopolymerizable compositions of the present invention are mixtures comprising the above-described ethylenic compound and the photopolymerizable initiator as essential components. However, to give high film-forming ability to the photopolymerizable compositions when the ethylenic compound has a low boiling point and the mixture of the ethylenic compound and the photopolymerization initiator is liquid at normal temperatures, or to increase the viscosity of the photopolymerizable compositions, polymers having film-forming ability which are compatible with the ethylenic compound and the photopolymerization initiator may be incorporated as a binder in the photopolymerizable compositions.

In photopolymerizable compositions for forming resist (thick) images on the photosensitive materials, such as photosensitive materials of carrying out stripping-off (or peeling-off) development or photosensitive materials of carrying out solvent development, it is preferred to use together with the composition a polymer material having film forming ability (i.e., binder). As the binder, though any polymer material can be used if it is compatible with the ethylenic compound and the photopolymerization initiator, it is preferred to select high molecular materials by which the stripping-off development, water development or aqueous weak alkali development can be carried out. Namely, the polymer materials are not only used as a mere film-forming agent for the above-described composition but also they should have affinity to water, aqueous weak alkali solutions or organic solvents used as developing solutions. For example, in the case of using a water-soluble organic high molecular material, water development becomes possible to carry out. Polymers sharing these characteristics have been frequently employed in photopolymerizable compositions and those skilled in the art are familiar with their selection. As such polymer materials, there are addition polymers having a carboxyl group in a side chain, for example, methacrylic acid copolymers, acrylic acid copolymers, itaconic acid copolymers, partially esterified maleic acid copolymers, maleic acid copolymers, crotonic acid copolymers, etc., and acid cellulose derivatives having a carboxyl group in a side chain. In addition, addition polymers having hydroxyl groups to which a cyclic acid anhydride (e.g., phthalic anhydride, maleic anhydride, succinic anhydride, glutaric anhydride, 3,3-dimethylglutaric anhydride, etc.) is added are useful. Further, as water-soluble polymers, polyvinyl pyrrolidone, polyethylene oxide, etc., are useful. Further, in order to increase film strength of the hardened portions of the film after exposure, alcohol-soluble nylon and polyether of 2,2-bis(4-hydroxyphenyl)propane and epichlorohydrin are also useful. Though these organic polymers may be incorporated in a suitable amount in the compositions, desirable results cannot be obtained from the viewpoint of image strength of the resulting films, if the amount exceeds 90% by weight based on the essential components (exclusive of the following solvent).

As linear polymer materials used for the photopolymerizable compositions capable of carrying out stripping-off development, there are chlorinated polyolefins (chlorine content: about 60% to about 75% by weight) such as chlorinated polyethylene or chlorinated polypropylene, etc., such as the chlorinated polyolefins taught in U.S. Pat. No. 4,050,936 and British Pat. No. 1,533,250, polymethyl methacrylate, polyacrylic acid, polymethacrylic acid, polyacrylic acid alkyl esters (examples of the alkyl group include methyl group, ethyl group and butyl group, etc.), copolymers of acrylic acid alkyl esters (the alkyl group means the same as described above) and at least one monomer selected from acrylonitrile, vinyl chloride, vinylidene chloride, styrene and butadiene, polyvinyl chloride, copolymers of vinyl chloride and acrylonitrile, polyvinylidene chloride, copolymers of vinylidene chloride and acrylonitrile, polyvinyl acetate, copolymers of vinyl acetate and vinyl chloride, polyvinyl alcohol, polyvinyl pyrrolidone, polyacrylonitrile, copolymers of acrylonitrile and styrene, terpolymers of acrylonitrile, butadiene and styrene, polyvinyl alkyl ethers (examples of alkyl group include methyl group, ethyl group, isopropyl group, butyl group, etc.), polymethyl vinyl ketone, polyethyl vinyl ketone, polyethylene, polypropylene, polybutene, polystyrene, poly-α-methylstyrene, polyamidos(6-nylon and 6,6-nylon, etc.), poly-1,3-butadiene, polyisoprene, polyurethane, polyethylene terephthalate, polyethylene isophthalate, chlorinated rubber, polychloroprene, ethyl cellulose, acetyl cellulose, polyvinyl butyral, polyvinyl formal, styrene-butadiene rubber, chlorosulfonated polyethylene, etc.

In the case of the copolymers, though the ratio of the monomers can be selected over a broad range, it is generally preferred that a molar ratio of the minor monomer component is in the range of from 10% to 50%. Further, any thermoplastic polymer molecular material other than the above-described materials can be used in the present invention, if it satisfies the above-described conditions.

In the above-described polymer materials, as the materials which are suitably used for the photopolymerizable compositions of the present invention, there are chlorinated polyethylene (chlorine content: about 60% by weight to about 75% by weight), chlorinated polypropylene (chlorine content: about 60% by weight to about 75% by weight), polymethyl methacrylate, polyvinyl chloride, vinyl chloride-vinylidene chloride copolymer (molar ratio of vinyl chloride: 20 to 80%), vinylidene chloride-acrylonitrile copolymer (molar ratio of acrylonitrile: 10 to 30%), vinyl chloride-acrylonitrile copolymer (molar ratio of acrylonitrile: 10 to 30%), polystyrene, polyvinyl butyral, polyvinyl acetate, polyvinyl formal, ethyl cellulose, acetyl cellulose, vinyl chloride-vinyl acetate copolymer, polychloroprene, polyisoprene, chlorinated rubber and chlorosulfonated polyethylene. The polymers which are usually and conveniently employed have a molecular weight of about 3,000 to 1,000,000.

Though these organic high molecular materials may be used alone, they can also be used as a mixture of two or more in a suitable ratio so as not to cause separation during the production steps comprising preparation of the coating solution, application and drying.

In the case that the above-described organic polymers are incorporated in the photopolymerizable compositions of the present invention as binders, the amount of them for forming excellent images varies according to the species of them. However, they are generally used in an amount of from about 10% to about 500%, and preferably from about 20% to about 200%, based on the weight of the ethylenic compound.

In the photopolymerizable compositions of the present invention, it is possible to add, if necessary, known additives such as thermal polymerization inhibiting agents, plasticizers, coloring agents, surface smoothing agents, surface protecting agents, etc. Examples of the thermal polymerization inhibiting agents include p-methoxyphenol, hydroquinone, alkyl or aryl substituted hydroquinones, t-butylcatechol, pyrogallol, phenothiazine, chloranil, naphthylamine, β-naphthol, 2,6-di-t-butyl-p-cresol, pyridine, nitrobenzene, dinitrobenzene, p-toluidine, etc. These thermal polymerization inhibiting agents may be incorporated in an amount of from about 0.001% to about 5%, preferably from about 0.01% to about 3%, based on the weight of the ethylenic compound. The thermal polymerization inhibiting agents have a function of increasing stability to the lapse of time before use of the photopolymerizable compositions of the present invention (before exposure).

As the coloring agents, there are pigments such as titanium oxide, carbon black, iron oxide, phthalocyanine pigments, azo pigments, etc., and dyes such as Methylene Blue, Crystal Violet, Rhodamine B, Fuchsine, Auramine, azo dyes, anthraquinone dyes, etc. It is, however, preferred that the coloring agents used do not absorb light having absorption wavelengths in the absorption range of the photopolymerization inhibitor. In the case that the coloring agent is a pigment, it is preferably incorporated in the amount of about 0.1 to 30 parts by weight based on the sum total 100 parts by weight of the ethylenic compound and the binder. In the case it is a dye, it is preferably incorporated in the amount of 0.01 to 10 parts by weight, particularly 0.1 to 3 parts by weight based on the sum total 100 parts by weight of the ethylenic compound and the binder. In the case that the above-described coloring agents are incorporated, it is preferred to use dichloromethyl stearate or other chlorinated aliphatic acids as auxiliary agents for the coloring agents, which can be used in the amount of about 0.005 to 0.5 part by weight based on one part by weight of the coloring agent.

However, when plasticizers are included in the photopolymerizable compositions, the auxiliary agents for the coloring agents are not necessary. As the plasticizers, there are phthalic acid esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate, diallyl phthalate, etc., glycol esters such as dimethyl glycol phthalate, ethyl phthalyl ethyl glycolate, methyl phthalyl ethyl glycolate, butyl phthalyl butyl glycolate, triethylene glycol dicaprylate, etc., phosphoric acid esters such as tricresyl phosphate, triphenyl phosphate, etc., dibasic aliphatic acid esters such as diisobutyl adipate, dioctyl adipate, dimethyl sebacate, dibutyl sebacate, dioctyl azelate, dibutyl maleate, etc., triethyl citrate, glycerin triacetyl ester and butyl laurylate, etc. As the surface smoothing agents, there are lanolin, paraffin waxes, natural waxes, etc.

The surface protecting agents are materials which have poor compatibility with the photopolymerizable compositions by which they are separated as a layer on the whole surface of the photopolymerizable composition or as a continuous insular or granular state on the surface of the photopolymerizable composition when subjected to a solvent treatment, or which further have a function of preventing polymerization-retardation by oxygen in the air. As the surface protecting agents, there are polystyrene, aliphatic carboxylic acids having 12 or more carbon atoms and amides thereof. Examples of the aliphatic carboxylic acids having 12 or more carbon atoms include lauric acid, myristic acid, palmitic acid, stearic acid, nonadecanoic acid, arachic acid, behenic acid, cerotic acid, heptacosanoic acid, montanic acid, melissic acid and lacceric acid. Examples of aliphatic acid amides having 12 or more carboxylic acids include amides of the above-described aliphatic acids.

The above-described various additives can be used in the amount of up to 3% by weight, and preferably up to 1% by weight, based on the whole weight of the photopolymerizable composition (exclusive of the following solvents).

The photopolymerizable composition of the present invention is used by dissolving it in a solvent to make a solution thereof, applying it to a support by a known method and removing the solvent (drying) to make a photopolymerizable photosensitive material, which is the most general way to use the photopolymerizable composition of the present invention.

As the solvents, there are ketones such as acetone, methyl ethyl ketone, methyl isobutyl ketone, cyclohexanone, diisobutyl ketone, etc., esters such as ethyl acetate, butyl acetate, amyl acetate, methyl formate, ethyl propionate, dimethyl phthalate, ethyl benzoate, etc., aromatic hydrocarbons such as toluene, xylene, benzene, ethylbenzene, etc., halogenated hydrocarbons such as carbon tetrachloride, trichloroethylene, chloroform, 1,1,1-trichloroethane, monochlorobenzene, chloronaphthalene, etc., ethers such as tetrahydrofuran, diethyl ether, ethylene glycol monomethyl ether, ethylene glycol monoethyl ether acetate, etc., dimethylformamide, dimethyl sulfoxide, etc.

As the support for applying the photopolymerizable compositions of the present invention as a suitable state (for example, the above-described solution), there are flat materials or materials having another shape which do not cause remarkable transformation. Examples of the flat materials include glass, silicon oxide, ceramics, paper, metals such as aluminium, zinc, magnesium, copper, iron, chromium, nickel, silver, gold, platinum, palladium, alloys comprising aluminium as a main component, alloys comprising zinc as a main component, alloys comprising magnesium as a main component, copper-zinc alloy, iron-nickel-chromium alloy or alloys comprising copper as a main component, metal compounds such as aluminium oxide, tin oxide ($SnO_2$) or indium oxide ($In_2O_3$), and polymers such as regenerated cellulose, cellulose nitrate, cellulose diacetate, cellulose triacetate, cellulose acetate butyrate, cellulose acetate propionate, polystyrene, polyethylene terephthalate, polyethylene isophthalate, polycarbonates of bisphenol A, polyethylene, polypropylene, nylons (6-nylon, 6,6-nylon, 6,10-nylon, etc.), polyvinyl chloride, vinyl chloride-vinyl acetate copolymer, vinyl chloride-acrylonitrile copolymer, vinyl chloride-vinylidene chloride copolymer, polyacrylonitrile, polymethyl acrylate or polymethyl methacrylate. Further, as the supports, it is possible to use laminates composed of two or more thin layers of the above-described materials, for example, cermet, an iron-aluminium laminate, an iron-copper-aluminium laminate, an iron-chromium-copper laminate, paper the surface of which was coated with polyethylene, paper the surface of which was coated with cellulose acetate, an aluminium plate having an aluminium oxide layer on its surface formed by anodic oxidation, a chromium plate having a chromium oxide layer on its surface formed by a known process, a glass plate having a tin oxide layer on its surface and a silicon oxide plate having an indium oxide on its surface.

In these supports, transparent ones or opaque ones are selected according to the purpose of the photosensitive image-forming material. In the case of transparent supports, not only colorless ones but also colored ones prepared by adding pigments or dyes as described in *J. SMPTE*, Vol. 67, p. 296 (1958) can be used. In a case of opaque supports, it is possible to use not only essentially opaque materials such as paper, metals, etc., but also materials prepared by adding pigments or dyes to transparent materials, plastic films the surface of which was treated by the process described in Japanese Patent Publication No. 19068/72 (corresponding to British Pat. No. 1,237,475) and completely light-intercepted paper or plastic films produced by adding carbon black, etc. Further, it is possible to use supports having fine hollows on the surface thereof formed by treatment such as sanding, electrolytic etching, anodic oxidation, chemical etching, etc., and supports the surface of which was subjected to preliminary treatment such as corona discharging, ultraviolet ray application, flame treatment, etc. Further, it is possible to use plastic supports reinforced by adding a reinforcing agent such as glass fibers, carbon fibers, boron fibers, metal fibers or metal whiskers, etc.

The supports may have, if necessary, another coating layer for making adhesion easy or an antihalation layer, an ultraviolet ray absorbing layer or a visible ray absorbing layer on the surface thereof.

Further, in order to prevent deterioration of the sensitivity by oxygen, it is possible to carry out exposing to light the compositons of the present invention with using a vacuum printing frame as described in U.S. Pat. No. 3,060,026, to provide a transparent cover which can be removed or to provide a coating layer having a low transmittance of oxygen on the sensitive layer as described in Japanese Patent Publication No. 17828/65.

As factors influencing the rate of photopolymerization, hardening and drying of the photopolymerizable compositions of the present invention, there is the amount of the photopolymerization initiator in the photopolymerizable composition, the thickness of the photopolymerizable composition layer, the properties of the light source (properties of applied spectra), intensity, presence or absence of oxygen or circumferential temperature, etc. Exposure to light may be carried out by any of various suitable methods or by a combination of them. For example, the compositions may be exposed to actinic radiation obtained from any light source, if an effective exposure is obtained. It is because the photpolymerizable compositions of the present invention show a higher sensitivity in a region of ultraviolet rays and visible rays from about 180 nm to about 600 nm of the wavelength. However, since the compositions of the present invention have sensitivity to short wavelength electromagnetic waves such as vacuum ultraviolet rays (ultraviolet rays in the range from about 1 nm to 190 nm of the wavelength), X-rays or γ-rays and particle rays such as electron rays, neutron rays or α-rays, they can be utilized for imagewise exposure. Examples of suitable light sources for ultraviolet radiation and visible radiation include sunlight, carbon arc lamps, mercurcy vapor lamps, xenon lamps, fluorescent lamps, argon glow discharge tubes, photographic floodlights, Van de Graf accelerators, etc.

The imagewise exposure time should be that sufficient to give an effective quantity of light. Though the imagewise exposure may be carried out at a suitable advantageous temperature, it is the most suitable for the reason of practical use that the imagewise exposure is carried out at room temperature, namely, in the range from 10° C. to 40° C. The compositions of the present invention hardened by light are in a dry state and have an excellent ink receiving property, hydrophilic-hydrophobic equilibrium, a stain removing property and an initial roll-up property (printing number at which a print capable of practically using is obtained), etc. Particularly, they are preferred to use as printing materials for lithography which have been previously sensitized and photo-resists, etc. The compositions of the present invention can be, of course, used as printing inks; adhesives for metal foils, films, paper, fabrics, etc.; photohardenable coatings used for metal, plastics, paper, woods, metal foils, fabrics, glass, cardboards, case making cardboards, etc., and marks for roads, parking zones, airports, etc.

In the case that the compositions of the present invention are used as vehicles for printing inks, they can be colored not only by a known amount of dyes but also by various kinds of known organic pigment such as molybdate orange, titanium white, chrome yellow, phthalocyanine blue, carbon black, etc. Further, the vehicle may be used in the amount of about 20% to 99.9% based on the whole weight of the composition and the coloring agents may be used in the amount of about 0.1 to 80% by weight based on the whole weight of the composition. Examples of materials to be printed include paper, clay coated paper and case making cardboards.

The compositions of the present invention are also suitable for treating fabrics composed of natural fibers or synthetic fibers. For example, they can be used in vehicles of printing inks for cloth or vehicles using for specific treatment of fabrics in order to give a waterproof property, oil resistance, an anti-stain property, anti-creasing property, etc.

In the case that the compositions of the present invention are used as adhesives, at least one of articles to be subjected to adhesion should be transparent to ultraviolet rays or visible rays. Typical examples of laminates obtained by adhesion of articles with using the compositions of the present invention include cellophane covered with a polymer such as cellophane covered with polypropylene, etc., metals such as aluminium or copper which are covered with a polyethylene film, and aluminium which is covered with a polypropylene film, etc.

The photopolymerizable compositions of the present invention can be used as coatings for applying to or printing the surface of metals, glass and plastics by a roller coating method or a spray coating method. Further, a color coating method may be used for glass, polyester films, vinyl polymer films, cellophane covered with polymers, and treated or nontreated polyethylene or treated or nontreated polypropylene used for, for example, disposable cups or bottles. Examples of materials to be coated include tin plates which were sized or not sized, too.

Photopolymerizable sensitive image-forming materials prepared from the photopolymerizable compositions of the present invention are materials which comprise a photosensitive layer compound of the composition of the present invention on a surface of a sheet or plate as the support.

As an embodiment of the sensitive image-forming materials using the compositions of the present invention, there is a product which comprises a layer of the composition of the present invention on the surface of a support and a transparent plastic film on the layer. In this embodiment, the element is used by stripping off the transparent plastic film just before exposure. Further, it is possible to advantageously use as the so-called stripping-off development type photosensitive material which is treated by a process comprising carrying out imagewise exposure through the transparent film thereof or through the support when it is transparent, and stripping off the transparent film, by which hardened portions of the layer which were polymerized by exposure remain on the support and non-hardened portions of the layer which were not exposed remain on the transparent plastic film (or the hardened portions of the layer which were polymerized by exposure remain on the transparent plastic film and the non-hardened portions which were not exposed remain on the support).

In the sensitive image-forming materials using the composition of the present invention, the imagewise exposure is carried out by exposing specified portions on the layer of the photopolymerizable composition to light till the addition polymerization reaction of the exposed portions concludes at a desired thickness. Then, the non-exposed portions of the composition layer are removed with using a solvent which does not dissolve polymers but dissolves only the ethylenic compounds (monomers or oligomers) or by the so-called stripping-off development. In a case of using in sensitive image-forming materials, the thickness of the photopolymerizable composition after the treatment by the solvent is about 0.5 µm to about 150 µm, and preferably about 2 µm to about 100 µm. A bending property deteriorates as increase of the thickness of the layer, and abrasion resistance decreases as decrease of the thickness of the layer.

In the case that the compositions of the present invention are used as printing inks, coating compositions or adhesives, they can be used without using volatile solvents. In that case, the resulted products have many advantages as compared with the known oil containing resinous or solvent type inks or coatings.

The photopolymerizable compositions of the present invention have a feature that they have high sensitivity to actinic radiation in the range from about 180 nm to about 600 nm wavelength. Accordingly, they have superior property to the prior photopolymerizable compositions, because they can be exposed with not only high pressure mercury lamps, super high pressure mercury lamps, high pressure xenon-mercury lamps, high pressure xenon lamps, halogen lamps and fluorescent lamps but also argon laser beams having 488 nm and 514.5 nm of the wavelength. Particularly, since scanning exposure can be carried out using the argon laser beams, they have very vast application fields, and they are used as photosensitive materials in many fields, such as for printed distributing plates in electronic industries, production of lithographic or relief printing plates or reproduction of optical images, etc. Accordingly, the present invention is very useful.

The present invention will be illustrated in greater detail with reference to the following Examples and Comparison Examples for them.

EXAMPLES 1–41 AND COMPARISON EXAMPLES 1–30

(1) Preparation of photosensitive material:

Components of photopolymerizable composition (solution):

| | |
|---|---|
| Pentaerythritol trimethacrylate (ethylenic compound) | 10 g |
| Photopolymerization initiator (compound described in Table 2) | 0.2 g |
| Compound (a) | 0.1 g (See Note 2) |
| Compound (b) | 0.1 g (See Note 2) |
| Binder (polymers described in Note 1) | 9 g |
| 1,2-Dichloroethane (solvent) | 40 g |

Note 1:
Chlorinated polyethylene: A high molecular substance having 69% by weight of the chlorine content and having about 90 cps of the viscosity of the 40 wt % solution in toluene at 25° C.
Polymethyl methacrylate: A high molecular substance having $[\eta]_{Methyl\ ethyl\ ketone}^{30°\ C.}$ of 0.282 of the limiting (or intrinsic) viscosity of the solution in methyl ethyl ketone at 30° C.

Note 2:
In the case that the compound (a) and the compound (b) are combined as the photopolymerization initiator, they are used in the amount of 0.1 g respectively (the sum total of them is 0.2 g). In the case that either the compound (a) or the compound (b) is used alone, it is used in the amount of 0.2 g. In Tables 2 to 4, a hyphen (-) means that the compound (a) or (b) is not used.

Components described hereinbefore were stirred for about 3 hours in a container to dissolve solid components to obtain a homogeneous solution. The resulting solution was applied to an aluminium plate having a thickness of 0.24 mm the surface of which was grained and subjected to anodic oxidation, and dried at 80° C. for 10 minutes to obtain photosensitive materials. The thickness of the layer of the photopolymerizable composition (the photosensitive layer) after drying was about 10 µm.

(2) Measurement of sensitivity of photosensitive material:

(2.1) On the photosensitive layer of the photosensitive material obtained in (1), a transparent polyethylene terephthalate film having 16 μm of the thickness was superposed, and an optical wedge having 0.15 of the optical density difference (number of optical step: 0–15 steps, the minimum optical density: 0.10, and the maximum optical density: 2.30) was put on the polyethylene terephthalate film. After being imagewise exposed for 30 seconds at a distance 50 cm from a light source (mercury lamp, power: 2 kw) through the optical wedge, the sensitive layer was treated with 1,1,1-trichloroethane for 30 seconds to carry out development. The maximum step number of the optical wedge corresponding to the resulting image is the sensitivity of the photosensitive material. The higher the step number is (the larger the value is), the higher the sensitivity is.

(2.2) On the sensitive layer of the photosensitive materials obtained in (1), a transparent polyethylene terephthalate film was laminated. The surface of the sensitive layer was scanned by an argon laser beam which emitted visible rays having 488 nm and 514.5 nm of the wavelength at 10 cm/sec. of the rate with varying the quantity of light so as to be 500 mW, 120 mW, 60 mW, 30 mW and 10 mW. The polyethylene film was then removed and the sensitive layer was treated with 1,1,1-trichloroethane for 30 seconds, by which unpolymerized portions not exposed were removed by dissolution and polymerized portions which were exposed to light remained on the aluminium plate as images. The lowest quantity of scanning light for image formation is the sensitivity of the photosensitive materials. The lower the quantity of scanning light for image formation is, the higher the sensitivity of the photosensitive material is The results obtained as described above are shown in Tables 2 to 4 together with the binder and the photopolymerization initiator. The compound (a) and the compound (b) are shown as the number of compound.

TABLE 2

Examples Carried out by the Process (2.1)

| Example No. | Binder | Photopolymerization Initiator Compound (a) | (b) | Sensitivity (step number) |
|---|---|---|---|---|
| 1 | Chlorinated polyethylene | a-2 | b-2 | 13 |
| 2 | Chlorinated polyethylene | a-3 | b-2 | 12 |
| 3 | Chlorinated polyethylene | a-11 | b-2 | 14 |
| 4 | Chlorinated polyethylene | a-5 | b-2 | 11 |
| 5 | Chlorinated polyethylene | a-6 | b-2 | 12 |
| 6 | Chlorinated polyethylene | a-20 | b-2 | 13 |
| 7 | Chlorinated polyethylene | a-7 | b-2 | 13 |
| 8 | Chlorinated polyethylene | a-12 | b-2 | 13 |
| 9 | Chlorinated polyethylene | a-21 | b-2 | 12 |
| 10 | Chlorinated polyethylene | a-13 | b-2 | 6 |
| 11 | Chlorinated polyethylene | a-8 | b-2 | 13 |
| 12 | Chlorinated polyethylene | a-9 | b-2 | 13 |
| 13 | Chlorinated polyethylene | a-14 | b-2 | 13 |
| 14 | Chlorinated polyethylene | a-15 | b-2 | 6 |
| 15 | Chlorinated polyethylene | a-16 | b-2 | 13 |
| 16 | Chlorinated polyethylene | a-17 | b-2 | 14 |
| 17 | Chlorinated polyethylene | a-1 | b-2 | 11 |
| 18 | Chlorinated polyethylene | a-18 | b-1 | 11 |
| 19 | Chlorinated polyethylene | a-18 | b-3 | 11 |
| 20 | Chlorinated polyethylene | a-18 | b-6 | 10 |
| 21 | Chlorinated polyethylene | a-18 | b-9 | 12 |
| 22 | Chlorinated polyethylene | a-18 | b-10 | 12 |
| 23 | Chlorinated polyethylene | a-18 | b-5 | 10 |
| 24 | Chlorinated polyethylene | a-18 | b-11 | 10 |
| 25 | Polymethyl methacrylate | a-1 | b-2 | 11 |
| 26 | Polymethyl methacrylate | a-22 | b-2 | 10 |
| 27 | Polymethyl methacrylate | a-9 | b-2 | 11 |
| 28 | Polymethyl methacrylate | a-17 | b-2 | 10 |
| 29 | Polymethyl methacrylate | a-5 | b-2 | 10 |
| 30 | Polymethyl methacrylate | a-8 | b-2 | 11 |
| 31 | Polymethyl methacrylate | a-6 | b-2 | 12 |
| 32 | Polymethyl methacrylate | a-2 | b-2 | 11 |
| 33 | Polymethyl methacrylate | a-11 | b-2 | 12 |

TABLE 3

Comparison Examples Carried out by the Process (2.1)

| Comparison Example No. | Binder | Photopolymerization Initiator Compound (a) | (b) | Sensitivity (step number) |
|---|---|---|---|---|
| 1 | Chlorinated polyethylene | a-2 | — | 0 |
| 2 | Chlorinated polyethylene | a-3 | — | 0 |
| 3 | Chlorinated polyethylene | a-11 | — | 0 |
| 4 | Chlorinated polyethylene | a-5 | — | 0 |
| 5 | Chlorinated polyethylene | a-6 | — | 0 |
| 6 | Chlorinated polyethylene | a-20 | — | 0 |
| 7 | Chlorinated polyethylene | a-7 | — | 0 |
| 8 | Chlorinated polyethylene | a-12 | — | 0 |
| 9 | Chlorinated polyethylene | a-21 | — | 0 |
| 10 | Chlorinated polyethylene | a-13 | — | 0 |
| 11 | Chlorinated polyethylene | a-8 | — | 1 |
| 12 | Chlorinated polyethylene | a-9 | — | 0 |
| 13 | Chlorinated polyethylene | a-14 | — | 0 |
| 14 | Chlorinated polyethylene | a-15 | — | 0 |
| 15 | Chlorinated polyethylene | a-16 | — | 0 |

TABLE 3-continued

Comparison Examples Carried out by the Process (2.1)

| Comparison Example No. | Binder | Photopolymerization Initiator Compound (a) | (b) | Sensitivity (step number) |
|---|---|---|---|---|
| 16 | Chlorinated polyethylene | a-17 | — | 1 |
| 17 | Chlorinated polyethylene | a-1 | — | 0 |
| 18 | Chlorinated polyethylene | — | b-2 | 0 |
| 19 | Chlorinated polyethylene | — | b-1 | 0 |
| 20 | Chlorinated polyethylene | — | b-3 | 0 |
| 21 | Chlorinated polyethylene | — | b-6 | 0 |
| 22 | Chlorinated polyethylene | — | b-9 | 0 |
| 23 | Chlorinated polyethylene | — | b-10 | 0 |
| 24 | Chlorinated polyethylene | — | b-5 | 0 |
| 25 | Chlorinated polyethylene | — | b-11 | 0 |

TABLE 4

Examples and Comparison Examples Carried out by the Process (2.2)

| Example No. | Binder | Photopolymerization Initiator Compound (a) | (b) | Quantity of Scanning Light by Argon Laser Beams (mW*) |
|---|---|---|---|---|
| Example 34 | Chlorinated polyethylene | a-9 | b-2 | 10 |
| Example 35 | Chlorinated polyethylene | a-9 | b-1 | 30 |
| Example 36 | Chlorinated polyethylene | a-21 | b-2 | 60 |
| Example 37 | Chlorinated polyethylene | a-17 | b-2 | 10 |
| Example 38 | Chlorinated polyethylene | a-7 | b-3 | 60 |
| Example 39 | Chlorinated polyethylene | a-12 | b-2 | 10 |
| Example 40 | Chlorinated polyethylene | a-5 | b-1 | 120 |
| Example 41 | Chlorinated polyethylene | a-19 | b-2 | 10 |
| Comparison Example 26 | Chlorinated polyethylene | a-9 | — | more than 500 |
| Comparison Example 27 | Chlorinated polyethylene | a-7 | — | more than 500 |
| Comparison Example 28 | Chlorinated polyethylene | a-5 | — | more than 500 |
| Comparison Example 29 | Chlorinated polyethylene | — | b-2 | more than 500 |
| Comparison Example 30 | Chlorinated polyethylene | — | b-1 | more than 500 |

*mW number per 3 mm of the beam diameter on the surface of the photosensitive layer.

From the results in Tables 2 to 4, it is clear that the photosensitive materials using the photopolymerizable compositions in the Examples have high sensitivity necessary to form images suitable for practical use with a high pressure mercury lamp and an argon laser, as compared with the Comparison Examples where desired images can be obtained by the above described operations.

In cases of photosensitive materials using the photopolymerizable composition containing chlorinated polyethylene as the binder, if the polyethylene terephthalate film is strongly pressed against the sensitive layer at preparation of the photosensitive materials to make a laminate, images are obtained by imagewise exposure to light and stripping off the polyethylene terephthalate film, by which unexposed portions of the photosensitive layer are removed together with the polyethylene terephthalate film and the exposed portions of the photosensitive layer which were hardened by polymerization remain on the aluminium plate.

While the invention has been described in detail and with reference to specific embodiments thereof, it will be apparent to one skilled in the art that various changes and modifications can be made therein without departing from the spirit and scope thereof.

What is claimed is:

1. In a photopolymerizable composition comprising, as essential components, (A) a compound having at least one ethylenically unsaturated double bond capable of undergoing addition polymerization and (B) a photopolymerization initiator, the improvement wherein said component (A) is an oligoester acrylate or oligoester methacrylate obtained by esterification of acrylic or methacrylic acid, a polybasic acid and a polyol and said photopolymerization initiator consists essentially of a combination of (a) a 5-(substituted naphthol(1,2-D)oxazol-2-ylidene)ethylidene-2-thiohydantoin compound represented by formula (II) and (b) a 2,4,6-substituted-1,3,5-triazine compound represented by formula (III):

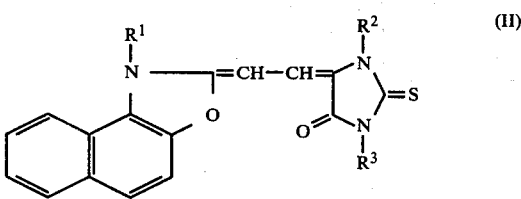

(II)

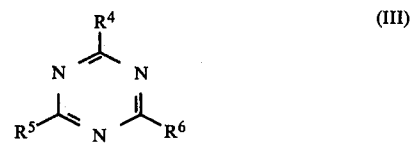

(III)

wherein $R^1$, $R^2$ and $R^3$ each represents an alkyl group, a substituted alkyl group, an alkenyl group, an aryl group, a substituted aryl group or an aralkyl group, which may be the same or different; and $R^4$, $R^5$ and $R^6$ each represents an alkyl group, a substituted alkyl group, an aryl group, a substituted aryl group or an aralkyl group, which may be the same or different but at least one of which represents a mono-, di- or trihalogenomethyl group.

2. A photopolymerizable compositions of claim 1, which additionally contains (C) a polymer material having a film-forming ability and being compatible with the components (A) and (B), as a binder.

3. The photopolymerizable composition of claim 1 or 2, wherein $R^1$, $R^2$ and $R^3$ each represents a substituted or unsubstituted straight or branched chain alkyl group containing 1 to 18 carbon atoms, a substituted or unsubstituted aryl group containing 6 to 14 carbon atoms, an aralkyl group the alkyl moiety of which contains 1 to 10 carbon atoms and the aryl moiety of which contains 6 to 10 carbon atoms; and a straight or branched chain alkenyl group containing 2 to 4 carbon atoms.

4. The photopolymerizable composition of claim 1 or 2, wherein said $R^4$, $R^5$ and $R^6$ represent a substituted or unsubstituted straight or branched chain alkyl group containing 1 to 18 carbon atoms, a substituted or unsubstituted aryl group containing 6 to 14 carbon atoms; or an aralkyl group the alkyl moiety of which contains 1 to 10 carbon atoms, and the aryl moiety of which contains 6 to 10 carbon atoms provided that at least one of $R^4$, $R^5$ and $R^6$ represents a mono-, di- or trihalogenomethyl group.

5. The photopolymerizable composition of claim 1 or 2, wherein said triazine is substituted at $R^4$, $R^5$ and $R^6$ with a halomethylgroup.

6. The photopolymerizable composition of claim 1 or 2, wherein the ratio of said thiohydantoin compound (a) to said triazine compound (b) is in a range of from about 1:10 to about 10:1.

7. The photopolymerizable composition of claim 1 or 2, wherein the total amount of said photopolymerization initiators is from about 0.1% to about 20% by weight.

8. The photopolymerizable composition of claim 2, wherein said binder is selected from the group consisting of chlorinated polyethylene, chlorinated polypropylene, polymethyl methacrylate, polyvinyl chloride, vinyl chloride-vinylidene chloride copolymer, vinylidene chloride-acrylonitrile copolymer, vinyl chloride-acrylonitrile copolymer, polystyrene, polyvinyl butyral, polyvinyl acetate, polyvinyl formal, ethyl cellulose, acetyl cellulose, vinyl chloride-vinyl acetate copolymer, polychloroprene, polyisoprene, chlorinated rubber and chlorosulfonated polyethylene.

9. The photopolymerizable composition of claim 1, wherein said oligoester is represented by the formula:

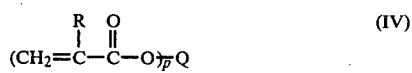

wherein R represents a hydrogen atom or a methyl group, Q represents an ester residue having a molecular weight of less than 10,000 composed of a polyhydric alcohol and a polybasic carboxylic acid which contains at least one ester bond, and p is an integer of 1 to 6.

10. The photopolymerizable composition of claim 1, wherein said polyol is selected from the group consisting of ethylene glycol, 1,2-propylene glycol, 1,4-butanediol, 1,6-hexanediol, trimethylolpropane, trimethylolethane, 1,2,6-hexanetriol, glycerine, pentaerythritol, sorbitol, diethylene glycol, triethylene glycol, tetraethylene glycol, decaethylene glycol, tetradecaethylene glycol, polyethylene glycol, dipropylene glycol, tripropylene glycol, tetrapropylene glycol, and polypropylene glycol.

11. The photopolymerizable composition of claim 1 wherein said polybasic carboxylic acid is selected from the group consisting of aromatic polybasic carboxylic acids, unsaturated aliphatic polycarboxylic acids, and saturated aliphatic polybasic acids.

12. The photopolymerizable composition of claim 11 wherein said polybasic carboxylic acid is selected from the group consisting of phthalic acid, isophthalic acid, terephthalic acid, tetrachlorophthalic acid, tetrabromophthalic acid, trimellitic acid, pyromellitic acid, benzophenone dicarboxylic acid, maleic acid, fumaric acid, 2-tetrahydrophthalic acid, 4-tetrahydrophthalic acid, 5-norbornene-2,3-dicarboxylic acid, itaconic acid, malonic acid, succinic acid, glutaric acid, adipic acid, pimelic acid, sebacic acid, and dodecanoic acid.

13. The photopolymerizable composition of claim 1 wherein said oligoester is selected from the group consisting of

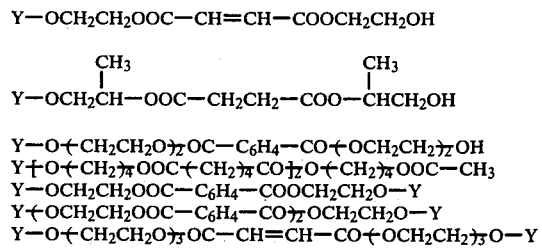

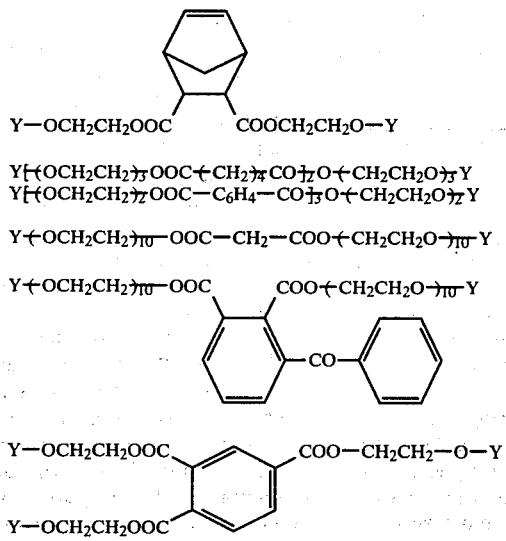

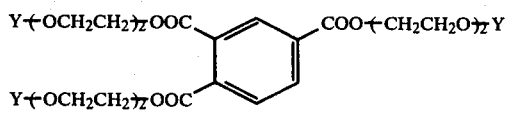
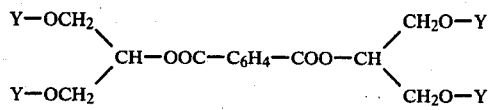
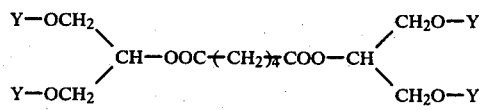
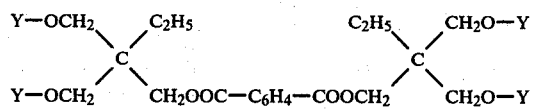
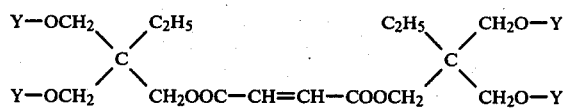
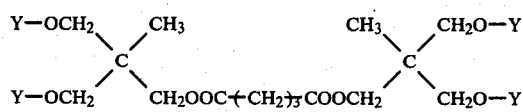
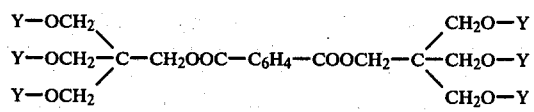
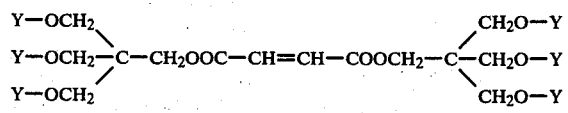
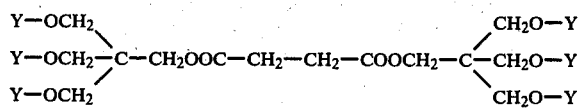
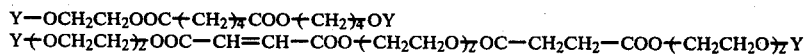
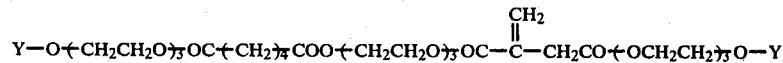
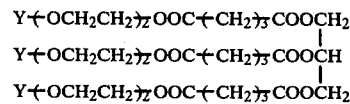
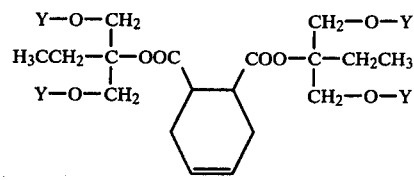

-continued

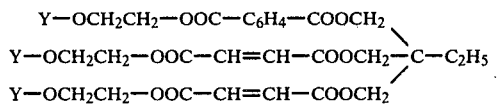
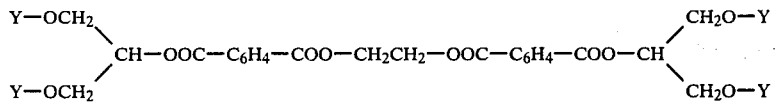
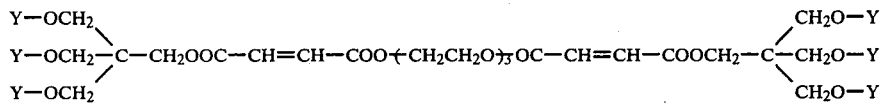

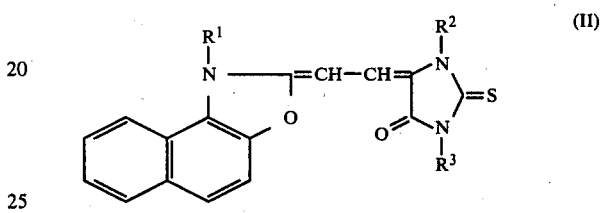

wherein Y represents one of the following two groups:

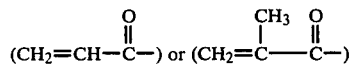

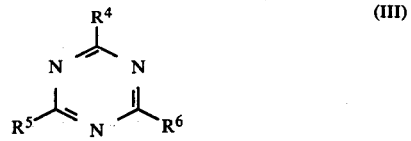

14. The photopolymerizable composition of claim 2 wherein said binder is chlorinated polyethylene.

15. The photopolymerizable composition of claim 2 wherein said binder is polymethyl methacrylate.

16. An imaging process for photopolymerizing a photopolymerizable composition comprising an oligoester acrylate or oligoester methacrylate obtained by the esterification of acrylic or methacrylic acid, a polybasic acid and a polyol and a photopolymerization initiator which consists essentially of a combination of (a) (a 5-(substituted naphthol(1,2-D)oxazol-2-ylidene)ethylidene-2-thiohydantoin compound) represented by formula (II) and (b) a 2,4,6-substituted-1,3,5-triazine compound represented by formula (III):

wherein $R^1$, $R^2$ and $R^3$ each represents an alkyl group, a substituted alkyl group, an alkenyl group, an aryl group, a substituted aryl group or an aralkyl group, which may be the same or different; and $R^4$, $R^5$ and $R^6$ each represents an alkyl group, a substituted alkyl group, an aryl group, a substituted aryl group or an aralkyl group, which may be the same or different but at least one of which represents a mono-, di- or trihalogenomethyl group, wherein said process comprises imagewise exposing to an Argon laser beam a layer of said photopolymerizable composition on a substrate, whereby the exposed areas of said layer are polymerized.

* * * * *